(12) United States Patent
Maxl

(10) Patent No.: US 12,113,380 B2
(45) Date of Patent: Oct. 8, 2024

(54) PRE-CHARGE UNIT FOR CHARGING A DC LINK CAPACITOR AND BATTERY SYSTEM INCLUDING THE SAME

(71) Applicant: SAMSUNG SDI CO., LTD., Yongin-si (KR)

(72) Inventor: Florian Maxl, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 445 days.

(21) Appl. No.: 17/381,398

(22) Filed: Jul. 21, 2021

(65) Prior Publication Data

US 2022/0029427 A1    Jan. 27, 2022

(30) Foreign Application Priority Data

Jul. 22, 2020  (EP) ..................................... 20187208
Jul. 19, 2021  (KR) ........................ 10-2021-0094192

(51) Int. Cl.
| | | |
|---|---|---|
| *H02J 7/00* | (2006.01) | |
| *H02J 7/34* | (2006.01) | |
| *H05K 1/02* | (2006.01) | |
| *H05K 1/16* | (2006.01) | |

(52) U.S. Cl.
CPC .......... *H02J 7/0013* (2013.01); *H05K 1/0201* (2013.01); *H05K 1/167* (2013.01); *H02J 7/345* (2013.01)

(58) Field of Classification Search
CPC ...... H02J 7/0013; H02J 7/345; H02J 2207/50; H02J 7/00304; H02J 7/00; H02J 7/00309; H05K 1/0201; H05K 1/167; H05K 2201/09672; H05K 2201/09263; H05K 2201/09309; H05K 2201/09727; H05K 2201/10037; H05K 1/11; H05K 1/18
USPC .................................................. 320/116, 107
See application file for complete search history.

(56) References Cited

U.S. PATENT DOCUMENTS

| | | | | |
|---|---|---|---|---|
| 5,561,380 A | * | 10/1996 | Sway-Tin ............ | G01R 31/007 324/426 |
| 6,133,707 A | * | 10/2000 | Kikuchi .................. | B60L 58/10 320/136 |
| 7,560,935 B2 | * | 7/2009 | Morimoto ............. | B60L 3/0023 324/509 |

(Continued)

FOREIGN PATENT DOCUMENTS

| | | |
|---|---|---|
| CN | 101091277 A | 12/2007 |
| CN | 102481858 A | 5/2012 |

(Continued)

OTHER PUBLICATIONS

Machine Translation for DE 102014107742 A1 to Ausperger (Year: 2015).*

(Continued)

*Primary Examiner* — M Baye Diao
(74) *Attorney, Agent, or Firm* — Lee IP Law, P.C.

(57) ABSTRACT

A pre-charge unit for charging a DC link capacitor includes a printed circuit board including at least one conductive layer; a pre-charge switch on the printed circuit board; and a pre-charge resistor electrically connected in series with the pre-charge switch, wherein the pre-charge resistor is formed by a conductive trace in the at least one conductive layer of the printed circuit board.

15 Claims, 4 Drawing Sheets

(56) References Cited

U.S. PATENT DOCUMENTS

| | | | |
|---|---|---|---|
| 8,159,438 B2 * | 4/2012 | Nakajima | G09G 3/3648 |
| | | | 345/94 |
| 9,166,414 B2 * | 10/2015 | Kim | H02J 7/0048 |
| 9,839,131 B2 * | 12/2017 | Chamberlin | H05K 1/092 |
| 10,464,436 B2 * | 11/2019 | Fritz | H02J 7/0068 |
| 2006/0141326 A1 | 6/2006 | Artibise et al. | |
| 2011/0049977 A1 | 3/2011 | Onnerud et al. | |
| 2013/0113430 A1 * | 5/2013 | Kim | H02J 7/0032 |
| | | | 320/136 |
| 2014/0028088 A1 | 1/2014 | Salziger et al. | |
| 2015/0069829 A1 | 3/2015 | Dulle et al. | |
| 2015/0229123 A1 * | 8/2015 | Ngo | H02H 9/026 |
| | | | 307/109 |
| 2016/0380315 A1 * | 12/2016 | Weicker | H02J 7/1423 |
| | | | 320/136 |
| 2017/0194114 A1 | 7/2017 | Towers | |
| 2017/0229872 A1 * | 8/2017 | Ghotra | H02J 7/35 |
| 2018/0029490 A1 | 2/2018 | Fritz et al. | |

FOREIGN PATENT DOCUMENTS

| | | | | |
|---|---|---|---|---|
| CN | 108475596 A | | 8/2018 | |
| DE | 102013018412 A1 | | 5/2015 | |
| DE | 102014107742 A1 | | 12/2015 | |
| DE | 102014107742 B4 | * | 1/2019 | .......... B60L 11/1809 |
| EP | 3276775 A1 | | 1/2018 | |
| TW | I550985 B | * | 9/2010 | .............. B60L 58/14 |
| WO | WO 2018/065853 A1 | | 4/2018 | |

OTHER PUBLICATIONS

Extended European Search Report dated Jan. 19, 2021 for EP 20187208.2.
European Office action dated Jan. 27, 2023.
Chinese Office Action dated Sep. 28, 2023 (including a Search Report dated Sep. 26, 2023), of the corresponding Chinese Patent Application No. 202110829529.4.

* cited by examiner

PRE-CHARGE UNIT FOR CHARGING A DC LINK CAPACITOR AND BATTERY SYSTEM INCLUDING THE SAME

CROSS-REFERENCE TO RELATED APPLICATION

European Patent Application No. 20187208.2, filed on Jul. 22, 2020, in the European Intellectual Property Office, and entitled: "Pre-Charge Unit for Charging a DC Link Capacitor and Battery System Comprising the Same," and Korean Patent Application No. 10-2021-0094192, filed on Jul. 19, 2021, are incorporated by reference herein in their entirety.

BACKGROUND

1. Field

Embodiments relate to a pre-charge unit for a battery system including a plurality of battery cells for charging a DC link capacitor, a pre-charge circuit and a battery system including the same.

2. Description of the Related Art

A rechargeable or secondary battery differs from a primary battery in that the rechargeable or secondary battery can be repeatedly charged and discharged, while the latter provides only an irreversible conversion of chemical to electrical energy. Low-capacity rechargeable batteries may be used as power supply for small electronic devices, such as cellular phones, notebook computers and camcorders, while high-capacity rechargeable batteries may be used as the power supply for hybrid vehicles and the like.

A rechargeable battery may include an electrode assembly including a positive electrode, a negative electrode, and a separator interposed between the positive and negative electrodes, a case receiving the electrode assembly, and an electrode terminal electrically connected to the electrode assembly. An electrolyte solution may be injected into the case in order to enable charging and discharging of the battery via an electrochemical reaction of the positive electrode, the negative electrode, and the electrolyte solution. The shape of the case may be, e. g. cylindrical or prismatic.

SUMMARY

Embodiments are directed to a pre-charge unit for charging a DC link capacitor, the pre-charge unit including: a printed circuit board including at least one conductive layer; a pre-charge switch on the printed circuit board; and a pre-charge resistor electrically connected in series with the pre-charge switch, wherein the pre-charge resistor is formed by a conductive trace in the at least one conductive layer of the printed circuit board.

Embodiments are directed to a pre-charge circuit for charging a DC link capacitor, including: a pre-charge unit according to an embodiment; and a plurality of battery cells electrically connected to the pre-charge switch of the pre-charge unit.

Embodiments are directed to a battery system including a pre-charge circuit according to an embodiment, and a vehicle including the battery system.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
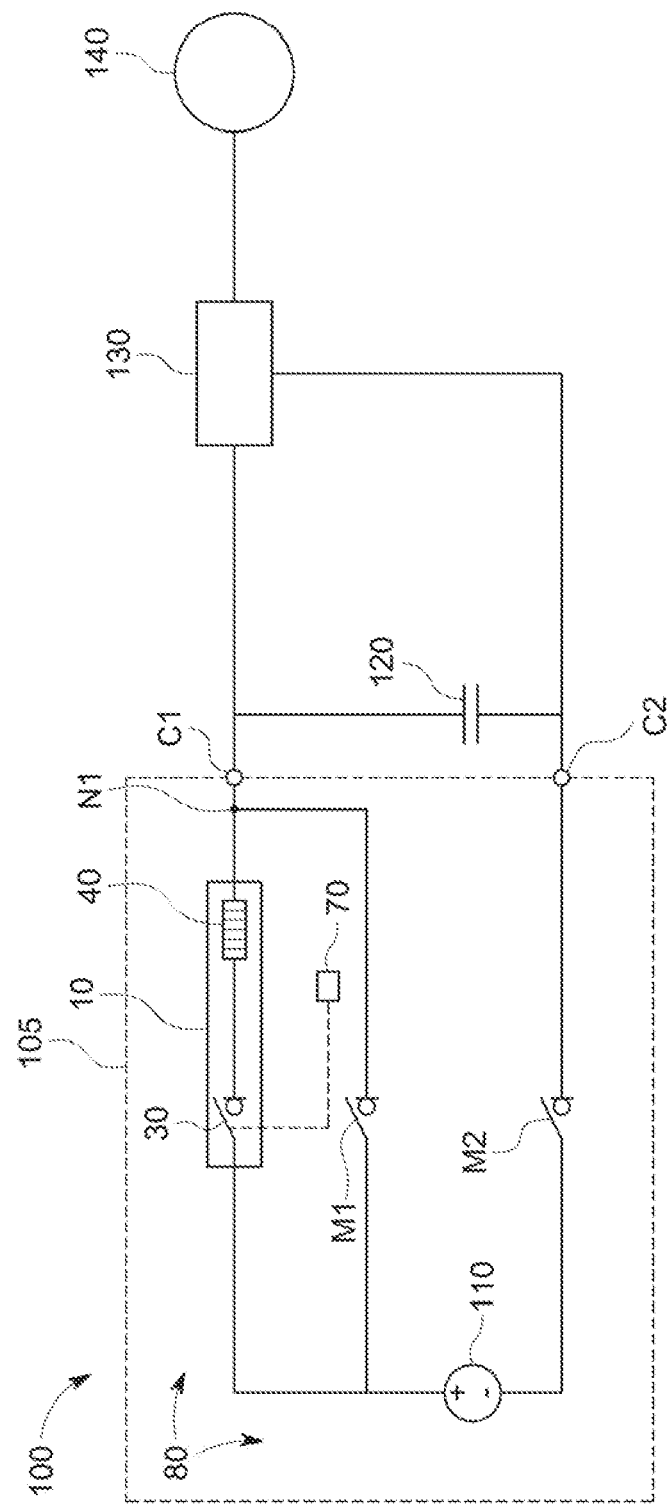
FIG. 1 illustrates a schematic view of a pre-charge unit and a battery system according to an example embodiment.

As used herein, the term "and/or" includes any and all combinations of one or more of the associated listed items.

It will be understood that although the terms "first" and "second" may be used to describe various elements, these elements should not be limited by these terms. These terms are only used to distinguish one element from another element. For example, a first element may be named a second element and, similarly, a second element may be named a first element.

In the following description, the terms of a singular form may include plural forms unless the context clearly indicates otherwise.

It will be further understood that the terms "comprise," "include," "comprising," or "including" may specify a property, a region, a fixed number, a step, a process, an element, a component, and a combination thereof but do not exclude other properties, regions, fixed numbers, steps, processes, elements, components, and combinations thereof.

It will also be understood that when a film, a region, or an element is referred to as being "above" or "on" another film, region, or element, it can be directly on the other film, region, or element, or intervening films, regions, or elements may also be present.

Herein, the terms "upper" and "lower" are defined according to the z-axis. For example, the upper cover is positioned at the upper part of the z-axis, whereas the lower cover is positioned at the lower part thereof. In the drawings, the sizes of elements may be exaggerated for clarity. For example, in the drawings, the size or thickness of each element may be arbitrarily shown for illustrative purposes, and thus the embodiments should not be construed as being limited thereto.

As described herein, a pre-charge unit for a battery system may be configured to use a plurality of battery cells for charging a DC link capacitor. The pre-charge unit may include a printed circuit board with at least one conductive layer. The pre-charge unit may include a pre-charge switch mounted on or attached to the printed circuit board. The pre-charge unit may include a pre-charge resistor electrically connected in series with the pre-charge switch. The pre-charge resistor may be formed by a conductive trace in the at least one conductive layer of the printed circuit board.

The ohmic resistance of the conductive trace may be set or defined by the width, thickness, and the trace length of the resistance trace. These parameters may be selected in advance, e.g., in advance of manufacturing, in order to set the resistance value. The pre-charge switch may be a pre-charge relay to switch high voltages, e.g., more than 100 V, e.g., more than 400 V. A conductive trace may be a copper trace, i.e., including copper. The conductive trace may also be referred to as conductive tracks.

According to an example embodiment, the resistance may be integrated in the printed circuit board together with the pre-charge switch, such that space and costs for cables may be reduced by avoiding the use of separate resistor-components and connecting cables. The printed circuit board used for the pre-charge switch may also be used to implement the resistor, which may provide for a more efficient use of the printed circuit board.

In an example embodiment, the conductive trace in the conductive layer may be formed to include a plurality of parallel aligned strip portions. Trace length of the conductive trace may be maximized in this manner.

In an example embodiment, a width of the conductive trace in the conductive layer may be larger than a distance between two parallel strip portions. Thus, the trace length of the conductive trace may be increased and sufficient electric resistance may be achieved. A high occupation area in case of printed circuit boards with a single conductive layer, e.g., above 50% or more, of the conductive traces with respect to the printed circuit board may be achieved.

In an example embodiment, the conductive trace may be formed to include wound end portions electrically connecting two adjacent strip portions. A steady, i.e., continuous, conductive trace may be formed that meanders through the area of the conductive layer.

In an example embodiment, the wound end portions may be positioned at an edge portion of the printed circuit board. The trace length of the conductive trace may be enhanced, which may be used to implement higher values for the electric resistance. Thus, the wound end portions may also be positioned at an edge portion of the conductive layer.

In an example embodiment, the conductive trace of the pre-charge resistor may be thermally coupled to a cooling plate disposed on at least one side of the conductive trace. A temperature rise and possible damage due to high temperatures due to resistive heating at the conductive traces may thus be prevented.

In an example embodiment, the printed circuit board may include at least two conductive layers each including a conductive trace and being vertically disposed on each other, wherein the pre-charge resistor is formed by the at least two conductive traces. Due to the two conductive layers, the trace length and thus the resistance value of the conductive trace may be beneficially increased. Also, an occupied area of each conductive layer, i.e., occupied by the conductive trace, may be reduced.

In an example embodiment, the conductive traces of different conductive layers may be electrically connected in series by at least one electrically conductive vertical interconnect, which vertically penetrates through at least one insulating layer interposed between the different conductive layers. The vertical interconnect may be, e.g., a via or vertical interconnect access. The via may be used to increase the electrical resistance of the combined conductive trace by providing a direct connection through one or more insulating layers. Due to the vertical interconnect, the trace length and thus the resistance of the connected trace may be enhanced or the occupation area of the conductive trace in each conductive layer may be reduced.

The at least one vertical interconnect unit may be positioned at an end portion of the conductive layers of the printed circuit board. The vertical interconnect units positioned at the end portion allows to achieve a maximum trace length in each conductive layer. Each conductive trace may be optimally used and maximum electrical resistance may be achieved.

In an example embodiment, a number of conductive layers each including a conductive trace may be two, or in an alternative embodiment, a number of conductive layers each including a conductive trace may be uneven, or odd. The use of two conductive layers may reduce complexity by reducing the number of conductive layers. The use of an uneven number of conductive layers may allow for positioning of the traces' end portions towards different ends of the printed circuit board, which may, e.g., simplify electrical coupling, e.g., to the pre-charge switch.

In an example embodiment, a fraction of an occupation area of the conductive layer occupied by the conductive trace compared to an overall area of the conductive layer at the pre-charge resistor may be less than 50%. Therefore, when two or more conductive layers are used, the trace length may be reduced and thus also the occupation area covered by the conductive trace may be made to have less occupation density. For example, the occupation area, in the case of two conductive layers, by the conductive traces may be, e.g., 74 $cm^2$, but this is merely an example.

In an example embodiment, a pre-charge circuit for charging a DC link capacitor may include a pre-charge unit according to an embodiment, as well as a plurality of battery cells electrically connected to the pre-charge switch of the pre-charge unit.

In an example embodiment, the control unit may be configured to open the pre-charge switch of the pre-charge unit based on a charging time that exceeds a predetermined charging time, wherein the predetermined charging time is based on the voltage of the battery cells and the resistance of the conductive trace. This may help prevent overheating of the conductive traces and the pre-charge resistor. It will be understood that Joule heating may depend on, e.g., applied voltage of the plurality of battery cells and the selected resistance value of the resistance trace. The control unit may calculate/determine a corresponding maximum charging time, e.g., in view of the Joule heating. A chosen charging time may lead to a less than fully charged DC link capacitor. However, it may be sufficient to prevent high current peaks while the integrity of the circuit is preserved. A maximum charging time may be less than 10 to 100 ms for voltages of above 100 V or 400 V, for example.

In an example embodiment, a battery system may include a pre-charge circuit and/or a pre-charge unit. In an example embodiment, a main switch and the pre-charging unit may be connected in parallel.

In an example embodiment, a vehicle may include a battery system according to an embodiment.

FIG. 1 shows a schematic view of a battery system.

Referring to FIG. 1, a battery system 100 according to an example embodiment may be provided with a pre-charge circuit 80 and a pre-charge unit 10 integrated in the battery system 100. Aspects of the pre-charge unit 10 will be described below in connection with FIGS. 2 to 4.

The battery system 100 may include a plurality of battery cells 110. The plurality of battery cells 110 are shown in FIG. 1 as battery voltage source, for ease of illustration. The plurality of battery cells 110 may also be part of the pre-charge circuit 80.

The battery system 100 may be accommodated in a battery enclosure 105. The battery system 100 may have electrical contacts C1, C2 to be electrically connected to load 140 and to supply the load with electrical power. The load 140 may be, e.g., a motor.

In an example embodiment, an inverter 130 may be interconnected between electrical contacts C1, C2 and the load 140. The inverter 130 may transform the output voltage generated by the plurality of battery cells 110 to a voltage used by the corresponding load 140. In an implementation, the inverter 130 may be a DC/DC converter.

The battery system 100 may be connected to an external DC link capacitor 120. The DC link capacitor 120 may be an intermediate capacitor to the load 140. The DC link capacitor 120 may be electrically connected to the load 140, e.g., via the inverter 130. The DC link capacitor 120 may be electrically connected to the electrical contacts C1, C2 of the battery system 100.

The battery system 100 may include a first main switch M1. The battery system 100 may further include a second main switch M2. In some embodiments, the second main switch M2 may be omitted. The main switches M1, M2 may be relays to switch high voltages, e.g., above 100 V, above 400 V or more. When the first main switch M1 or the first and the second main switches M1, M2 are a conductive state, i.e., a closed state, the main switches may electrically connect the plurality of battery cells 110 to the load 140. A control unit 70 may be provided that is configured to control the switches M1, M2. The control unit 70 may be a microcontroller. The microcontroller may be part of the battery management system.

When the external DC link capacitor 120 is sufficiently charged, the main switches M1, M2 may be closed without the generation of high current peak which may damage or even destroy the main switches M1 or M2. Thus, a charged DC link capacitor 120 may prevent the high current peaks upon closing the first main switch M1 and/or the second main switch M2. In this case, the charging of the DC link capacitor 120 is time to occur before closing the main switches M1, M2.

In an example embodiment, the battery system 100 includes the pre-charge circuit 80. The battery system 100 having the pre-charge circuit 80 may include a pre-charge unit 10 for charging the DC link capacitor 120.

The pre-charge unit 10 and the first main switch M1 may be connected in parallel and electrically connected to the plurality of battery cells 110. The pre-charge unit 10 and the main switch M1 may be electrically connected to a node N1. The node N1 may be electrically connected to the external DC link capacitor, to charge the DC link capacitor 120, and may be electrically connected to the load 140, to supply power depending on the switching state of the first main switch M1 and depending on the state of the pre-charge unit 10.

The pre-charge unit 10 may include a pre-charge switch 30. The pre-charge switch 30 may be controlled by the control unit 70 to charge the DC link capacitor 120. The pre-charge switch 30 may be electrically connected to the plurality of battery cells 110. If the second switch M2 is provided, then for pre-charging the second switch M2 may also be set conductive by the control unit 70.

Figure 2:
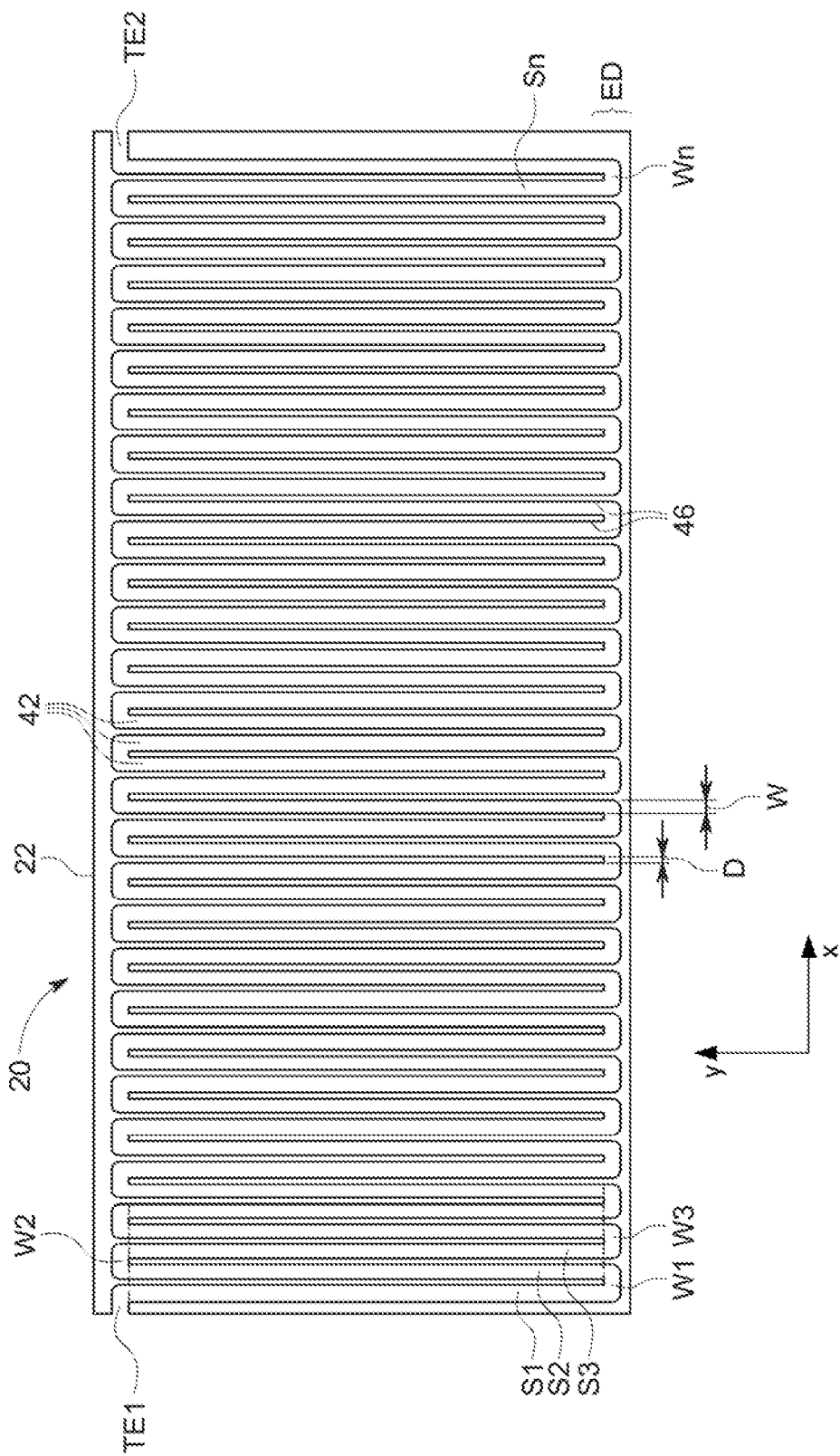
FIG. 2 illustrates a top view perspective of a part of the pre-charge resistor according to an example embodiment.

The pre-charge unit 10 may include a printed circuit board 20 (see, e.g., FIG. 2). The pre-charge switch 30 may be mounted on, or attached to, the printed circuit board 20.

Figure 3:
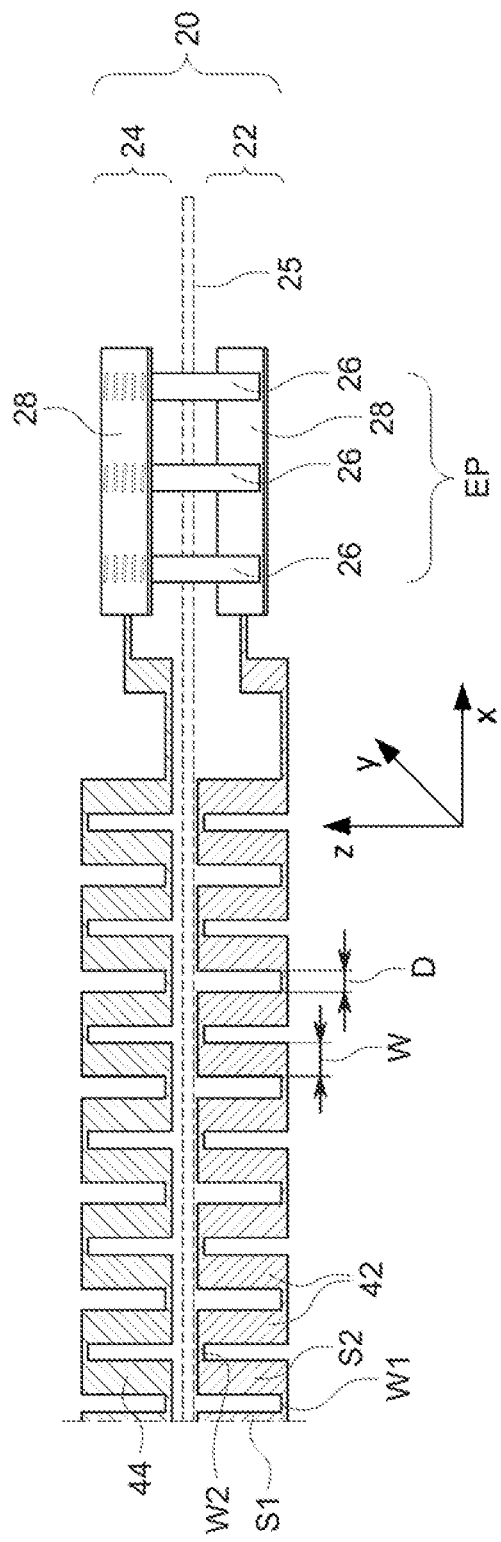
FIG. 3 illustrates a perspective view of a part of the pre-charge unit according to another example embodiment.
Figure 4:
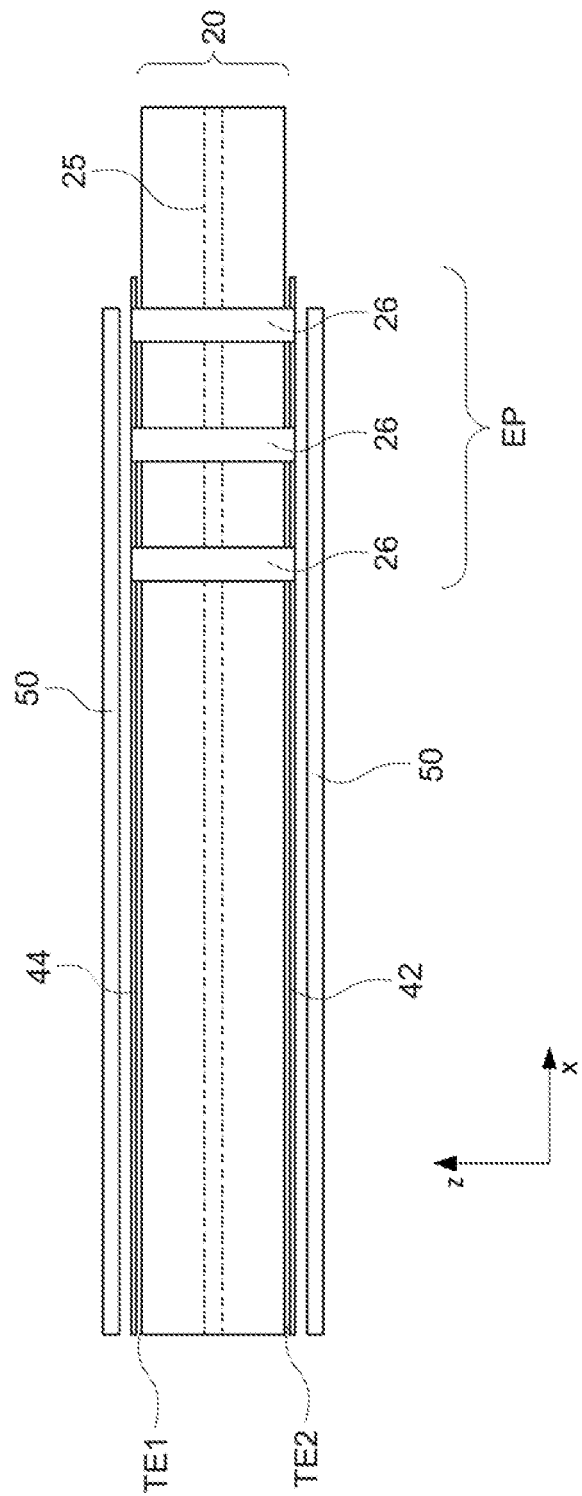
FIG. 4 illustrates a side view perspective of a part of the pre-charge unit according to another example embodiment.

Referring to FIGS. 2, 3, and 4, the printed circuit board 20 may include one or more conductive layers 22, 24, which may be formed in the printed circuit board 20. The conductive layer 22 may include a conductive trace 42. The conductive layer 24 may include a conductive trace 44. The conductive traces 42, 44 may be copper traces.

The pre-charge resistor 40 may be formed using one or more conductive traces, e.g., one or more of the conductive traces 42, 44 in the at least one conductive layer 22, 24 of the printed circuit board 20. The pre-charge resistor 40 formed by the conductive traces 42, 44 may be electrically connected in series with the pre-charge switch 30.

The resistance value of each of the conductive traces 42, 44 may be defined by the respective length, width, and thickness thereof.

In an example embodiment, a resistance for limiting currents is integrated in the printed circuit board 20 together with the pre-charge switch 30, which may avoid using a separate resistor. With no extra resistor mounted to the printed circuit board 20 and connected with wires, space and costs for cables may be reduced. The printed circuit board 20 may thus be efficiently used when the pre-charge switch 30 is installed in the printed circuit board 20 and the resistor is implemented by the conductive traces. Existing resources are thus used efficiently. The battery enclosure 105 may define a certain volume for the inner space and components, and an example embodiment may provide an advantage in terms of spatial compactness, which may be important when implementing battery systems in applications.

FIG. 2 shows a cross section, in top view perspective, of the printed circuit board 20 in which the pre-charge resistor 40 (used in the pre-charge unit 10) is formed. The cross section shows a conductive layer 22 of the printed circuit board 20. The conductive layer 22 includes the conductive trace 42 forming the pre-charge resistor 40. In an example embodiment, the conductive trace 42 may include copper.

In the example of FIG. 2, the printed circuit board 20 includes one conductive layer 22, while in the examples of FIGS. 3 and 4, more than one conductive layer is implemented.

For very high voltages of the plurality of battery cells 110, high currents may be associated therewith and thus, for higher voltages, higher resistances may be used. Thus, according to an example embodiment, a resistance may be provided to limit the current for higher battery voltages. For example, the resistances may be about 10Ω up to 100Ω or up to 1000Ω, while voltages larger than 100 V or larger than 400 V may be used.

The conductive trace 42 in the conductive layer 22 may be formed to include a plurality of parallel aligned strip portions S1, S2, S3, Sn. In an example embodiment, the strip portions S1, . . . , Sn may form the main contribution to the electrical resistance of the conductive trace 42, which may provide an efficient limitation of the electric current peaks in response to a closing of the pre-charge switch 30.

In an example embodiment, among the strip portions S1, . . . , Sn, adjacent parallel strip portions Si, Si+1 (1<i<n−1) may carry an electric current with mutually reverse direction.

Referring to FIG. 2 (and as can be viewed as well in FIG. 3), a width W of the conductive trace 42 in the conductive layer 22 may be larger than a distance D between two parallel strip portions Si, Si+1 for 1<i<n−1. The space between adjacent strip portions Si, Si+1 may include an insulator 46 that electrically separates the strip portions S1, . . . , Sn from their neighbor strip portion. A relatively short distance D may be defined so that only narrow gaps between the strip portions S1, . . . , Sn are generated and the trace length of the conductive trace 42 may be increased since the number of strip portions S1, . . . , Sn for a fixed length may be higher. Thus, the resistive length of the conductive trace 42 may be enhanced.

The conductive trace 42 may be further formed to include wound end portions W1, . . . , Wn. Each wound end portion W1, . . . , Wn may electrically connect two adjacent strip portions Si, Si+1. The wound end portions may have at least a curved section or may be entirely curved. The wound end portions W1, . . . , Wn may provide 180° degree turn of the conductive trace 42. The wound end portions W1, . . . , Wn may be arranged so that the conductive trace meanders over the entire area of the conductive layer 22. In an example embodiment, the wound end portions W1, . . . , Wn may be positioned at an edge portion ED of the printed circuit board 20 and, thus, may efficiently use the available geometrical area/space. A width of the printed circuit board 20 and/or the conductive layer 22 may be increased to increase the trace length of each strip portion S1, . . . , Sn and thereby the conductive trace 42.

The conductive trace 42 may be formed so that a fraction of an occupied area of the conductive layer 22/printed circuit board 20 occupied by the conductive trace 42 in plan view compared to the area of the conductive layer 22, 24 at the pre-charge resistor 40 may be above 50% in the case of only one conductive layer 22. The area provided by the printed circuit board 20, in particular, the conductive layer 22 may then efficiently be used for forming the resistance of the pre-charge resistor 40.

When the printed circuit board 20 includes only one conductive layer 22, the conductive trace 42 may include two trace end portions TE1, TE2 on opposite sides for connecting the conductive trace 42 with the pre-charge switch 30 and the wirings to the load 140. The trace end portions TE1, TE2 may be positioned at opposing ends of the pre-charge resistor 40. The trace end portions TE1, TE2 may be positioned on opposite sides with respect to the strip portions S1, . . . , Sn and including the strip portions S1, . . . , Sn therein between.

Referring again to FIG. 1, the pre-charge circuit 80 may include the plurality of battery cells 110. Further, the pre-charge circuit 80 may include the control unit 70 configured to open, i.e., set non-conductive, the pre-charge switch 30 of the pre-charge unit 10 based on a charging time being above a predetermined charging time. Thus, the conductive trace 42 on the printed circuit board 20 may be heated up due to resistive heating. The predetermined charging time may be calculated based on the voltage of the plurality of battery cells 110 and the resistance of the conductive trace 42. The control unit 70 may be a microprocessor, e.g., of the battery management system. The predetermined charging time may be in the range of less than 100 ms, e.g., less than 50 ms or less than 10 ms. The charging time may be adjusted such that high temperature risks at the conductive trace 42 are reduced.

FIGS. 3 and 4 illustrate a pre-charge resistor 40 according to another example embodiment. In particular, FIG. 3 shows a perspective view while FIG. 4 shows a side view of the pre-charge resistor 40.

In the present example embodiment, the printed circuit board 20 may include two conductive layers 22, 24, wherein each conductive layer 22, 24 includes a respective conductive trace 42, 44, e.g., as illustrated in FIGS. 3 and 4. The pre-charge resistor 40 may be formed by the conductive traces 42, 44, such that high resistances may be generated.

In other example embodiments, the number of conductive layers 22, 24 each including a conductive trace 42, 44 may be three or four, for example. The conductive layers 22, 24 may be vertically disposed on each other, as for the example embodiment in FIGS. 3 and 4. The pre-charge resistor 40 may then formed by the two conductive traces 42, 44. Each of the conductive traces 42, 44 may be formed in the same manner as the embodiments discussed above with respect to the example embodiments of FIGS. 1 and 2.

The conductive traces 42, 44 of the two different conductive layers 22, 24 may be electrically connected in series. Thus, the trace length of the common conductive layers 22, 24 may be approximately doubled. At least one electrically conductive vertical interconnect 26 may be provided. In the example embodiment illustrated in FIGS. 3 and 4, three vertical interconnects 26 are provided, as an example. Referring to FIG. 3, the vertical interconnects 26 may vertically penetrate through at least one insulating layer 25, which is interposed between the conductive layers 22, 24. The conductive layers 22, 24 may each include an electrically conductive connector plate 28 to which the vertical interconnect access 26 may be respectively connected to. The trace length of the conductive trace may thus be increased for higher resistance. Also, the occupation area of the conductive trace 42, 44 per conductive layer 22, 24 may be reduced due to the use of two traces.

The vertical interconnect 26 may be positioned at an end portion EP of the conductive layers 22, 24. For example, each of the three vertical interconnects 26 may be formed at an end portion EP, and the full conductive trace 42, 44 of each conductive layer is 22, 24 may be used in full length.

In the present embodiment, the trace end portions T1, T2 may be positioned on the same side with respect to the strip portions S1, . . . m Sn of the conductive traces 42, 44 (see for example FIG. 4). In an example embodiment, a number of conductive layers 22 each including a conductive trace 42 may be odd, for example 3, 5 or 7 or 1 in accordance with FIG. 2, in which case the trace end portions may be positioned on opposite sides similar to the example embodiment discussed above with reference to FIG. 1.

By using more than one conductive layer 22 for providing a resistance, the conductive layer 22 may be formed such that a fraction of an occupied area of the conductive layer 22/printed circuit board 20 occupied by the conductive trace 42 in plan view compared to the area of the conductive layer 22, 24 at the pre-charge resistor 40 may be less than 50%. Due to the two or more conductive layers, in this example embodiment, the trace length per conductive layer 22, 24 may be reduced compared to the case in which only one conductive layer is used, see e.g., FIG. 2. The loss of trace length per conductive layer 22, 24 may be compensated for by using the series connections of the conductive layers 22, 24 of different conductive traces 42, 44.

Referring to FIG. 4, in an example embodiment, one or more of the conductive traces 42, 44 of the pre-charge resistor 40 may be thermally coupled to a cooling plate 50. The cooling plate 50 may be disposed on at least one side of the conductive traces 42, 44. The pre-charge resistor 40 may be thermally coupled to the cooling plate 50 disposed on at least one side of the printed circuit board 20. Referring to FIG. 4, the cooling plate 50 may be placed on both sides of the of the printed circuit board 20 at least at the conductive traces 42, 44 to effectively transport heat created due to Joule-heating when current is transported through conductive traces 42, 44. The cooling plate 50 may also be used in the embodiment of FIG. 2 to help prevent high temperature states.

By way of summation and review, a battery pack may be implemented with a set of any number of (e.g., identical) battery systems or battery modules, which may be configured in series, parallel, or a mixture of both to deliver the desired voltage, capacity, or power density. Components of battery packs may include the individual battery systems/modules, and interconnects that provide electrical conductivity therebetween.

Rechargeable batteries may be used in a battery system or a battery module formed of a plurality of unit battery cells coupled in series and/or in parallel so as to provide a high energy density, e.g., for motor driving of a hybrid or fully electric vehicle. Thus, the battery system may be formed by interconnecting the electrode terminals of the plurality of unit battery cells depending on an intended amount of power and in order to realize a high-power rechargeable battery.

For meeting the dynamic power demands of various electrical consumers connected to the battery system, a static control of battery power output and charging may be replaced by a steady exchange of information between the battery system and the controllers of the electrical consumers. This information may include, e.g., the battery systems actual state of charge (SoC), potential electrical performance, charging ability, internal resistance, and actual or predicted power demands or surpluses of the consumers.

Battery systems may include a battery management system (BMS) and/or battery management unit (BMU) for processing the aforementioned information. The BMS/BMU may communicate to the controllers of the various electrical consumers via a suitable communication bus, e.g., a SPI or CAN interface. The BMS/BMU may further communicate with each of the battery submodules, e.g., with a cell supervision circuit (CSC) of each battery submodule. The CSC may be further connected to a cell connection and sensing unit (CCU) of a battery submodule that interconnects the battery cells of the battery submodule. Thus, the BMS/BMU may be provided for managing the battery system or battery pack, such as by protecting the battery system/pack from operating outside its safe operating area, monitoring its state, calculating secondary data, reporting that data, controlling its environment, authenticating it and/or balancing it.

By way of summation and review, in general when electrically connecting a battery voltage source of a battery system including a plurality of battery cells to a load, a DC link capacitor, which is connected parallel and intermediate to the load, may be charged before the main contactors/switches are closed. The charged DC link capacitor may prevent high current peaks during the closing of the main contactors. Such high current peaks can be very harmful for the contactors.

In general, an ohmic pre-charge resistor with a resistance of 10Ω up to 100Ω may be used and electrically interconnected between the battery voltage source, i. e. the plurality of coupled battery cells, and the DC link capacitor. When the DC link capacitor is sufficiently charged, the main contactors may be closed and the current peaks may be reduced. The ohmic resistor may be a high power device and may be enclosed in ceramics, or may be formed as a copper wire that is wound around a ceramic core. However, such solutions for the pre-charge resistor may consumes space, e.g., in a HV battery system enclosure, and may require separate wires and connectors to the bus bars of the plurality of battery cells, which may lead to higher costs.

In recent years, vehicles for transportation of goods and peoples have been developed using electric power as a source for motion. Such an electric vehicle is an automobile that is propelled by an electric motor, using energy stored in rechargeable batteries. An electric vehicle may be solely powered by batteries or may be a form of hybrid vehicle additionally powered by for example a gasoline generator. Furthermore, the vehicle may include a combination of electric motor and conventional combustion engine. In general, an electric-vehicle battery (EVB) or traction battery is a battery used to power the propulsion of battery electric vehicles (BEVs). Electric-vehicle batteries differ from starting, lighting, and ignition batteries because they are designed to give power over sustained periods of time. Lithium-ion (and similar lithium polymer) batteries, widely known via their use in laptops and consumer electronics, dominate the most recent group of electric vehicles in development.

As described above, embodiments may provide a pre-charge unit and a battery system which can be compactly integrated, thereby reducing volume space, while providing sufficient resistance to limit switching currents.

REFERENCE SIGNS 10 pre-charge unit
20 printed circuit board
22 conductive layer
24 conductive layer
25 insulating layer
26 vertical interconnect unit
28 connector plate
30 pre-charge switch
40 pre-charge resistor
42 conductive trace
44 conductive trace
46 insulator
50 cooling plate
70 control unit
80 pre-charge circuit
100 battery system
105 enclosure
110 battery cells
120 DC link capacitor
130 inverter
140 load
C1 electrical contact
C2 electrical contact
N1 node
S1, . . . , Sn strip portion
W1, . . . , Wn wound end portions
ED edge portion
W width
D distance
M1 main switch
M2 main switch
EP end portion
TE1 trace end portion
TE2 trace end portion Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pre-charge unit for charging a DC link capacitor, the pre-charge unit comprising:
   a printed circuit board including at least one conductive layer;
   a pre-charge switch on the printed circuit board; and
   a pre-charge resistor electrically connected in series with the pre-charge switch, wherein the pre-charge resistor is formed by a conductive trace in the at least one conductive layer of the printed circuit board.

2. The pre-charge unit as claimed in claim 1, wherein the conductive trace in the at least one conductive layer is formed to include a plurality of parallel aligned strip portions.

3. The pre-charge unit as claimed in claim 2, wherein a width of the conductive trace in the at least one conductive layer is larger than a distance between two parallel strip portions.

4. The pre-charge unit as claimed in claim 2, wherein the conductive trace in the at least one conductive layer is formed to include wound end portions electrically connecting two adjacent strip portions.

5. The pre-charge unit as claimed in claim 4, wherein the wound end portions are positioned at an edge portion of the printed circuit board.

6. The pre-charge unit as claimed in claim 1, wherein the conductive trace in the at least one conductive layer is thermally coupled to a cooling plate disposed on at least one side of the conductive trace.

7. The pre-charge unit as claimed in claim 1, wherein the printed circuit board includes at least two conductive layers each including a respective conductive trace and being vertically disposed on each other, wherein the pre-charge resistor is formed by the respective conductive traces.

8. The pre-charge unit as claimed in claim 7, wherein the respective conductive traces of different ones of the at least two conductive layers are electrically connected in series by at least one electrically conductive vertical interconnect, which vertically penetrates through at least one insulating layer interposed between different ones of the at least two conductive layers.

9. The pre-charge unit as claimed in claim 8, wherein the at least one vertical interconnect is positioned at end portions of two of the at least two conductive layers.

10. The pre-charge unit as claimed in claim 7, wherein the at least two conductive layers is two conductive layers, or the at least two conductive layers is an odd number of conductive layers.

11. The pre-charge unit as claimed in claim 7, wherein:
the at least two conductive layers have a first area that is occupied by the pre-charge resistor,
the conductive traces in the at least two conductive layers of the pre-charge resistor occupy less than 50% of the first area.

12. A pre-charge circuit for charging a DC link capacitor, comprising:
the pre-charge unit as claimed in claim 1; and
a plurality of battery cells electrically connected to the pre-charge switch of the pre-charge unit.

13. The pre-charge circuit as claimed in claim 12, further comprising a control unit configured to open the pre-charge switch of the pre-charge unit when a charging time exceeds a predetermined charging time,
wherein the predetermined charging time is determined based on a voltage of the plurality of battery cells and an overall resistance of the conductive trace in the pre-charge resistor.

14. A battery system, comprising the pre-charge circuit as claimed in claim 12.

15. A vehicle comprising the battery system as claimed in claim 14.

* * * * *